United States Patent [19]
Pierce

[11] 4,420,809
[45] Dec. 13, 1983

[54] FREQUENCY DETERMINING APPARATUS

[75] Inventor: Gordon F. Pierce, Peterborough, Canada

[73] Assignee: Canadian General Electric Company Limited, Toronto, Canada

[21] Appl. No.: 267,614

[22] Filed: May 27, 1981

[30] Foreign Application Priority Data

Aug. 20, 1980 [CA] Canada .................................. 358632

[51] Int. Cl.³ .............................................. G06F 15/20
[52] U.S. Cl. ................................. 364/484; 324/78 D;
377/19; 364/571
[58] Field of Search ......................... 364/484, 571, 569;
377/19, 20, 27, 49, 118; 324/78 R, 78 D;
307/271; 328/140

[56] References Cited
U.S. PATENT DOCUMENTS

| 2,769,595 | 11/1956 | Bagley | 377/27 |
| 3,304,504 | 2/1967 | Horlander | 364/484 |
| 3,882,303 | 5/1975 | Linder | 364/484 |
| 3,928,798 | 12/1975 | Valis | 324/78 D |
| 3,930,199 | 12/1975 | Valis | 364/484 |
| 4,027,146 | 5/1977 | Gilmore | 364/484 |
| 4,150,432 | 4/1979 | Sorden | 324/78 D |
| 4,268,792 | 5/1981 | Grob | 307/271 |
| 4,310,891 | 1/1982 | Niki | 364/484 |

OTHER PUBLICATIONS

Gosam Symposium–"An 8748 Based Frequency to Digital System" Gordon Francis Pierce.

Primary Examiner—Errol A. Krass
Attorney, Agent, or Firm—Raymond A. Eckersley

[57] ABSTRACT

A frequency determining apparatus for receiving an input signal of unknown frequency and providing an output signal representing the frequency where the output signal is updated at substantially regular intervals regardless of the frequency of the input signal. A frequency divider or prescaler divides the input signal by a factor n to give an adjusted signal. A gated counter counts stable clock pulses for a time period related to the period of the adjusted signal to give a count inversely related to the frequency of the adjusted signal. A calculator corrects the count for the factor n and derives an output signal representing the frequency of the input signal. The calculator also determines if the count has increased above an upper limit or decreased below a lower limit, and if so it changes the factor n accordingly to maintain the count and correspondingly the adjusted signal within a predetermined range. The count is updated in accordance with the period of the adjusted signal which is maintained within predetermined limits and consequently is updated at substantially regular intervals even though the frequency of the input signal changes greatly.

8 Claims, 3 Drawing Figures

FREQUENCY DETERMINING APPARATUS

BACKGROUND OF THE INVENTION

This invention relates to apparatus which receives a signal of unknown frequency and provides an output signal the value of which represents the frequency, and in particular it relates to such frequency determining apparatus which is suitable for use over a wide range of frequencies.

One form of frequency determining apparatus is the frequency to digital converter which provides a digital output signal representative of the frequency of the input signal. Frequency to digital converters are well known. One type of frequency to digital converter operates by determining the period of the input signal from two succeeding pulses or cycles and using this time period to count pulses from a stable, high frequency pulse generator. The count of pulses is inversely proportional to the frequency and hence the count can be used to provide a digital representation of the input signal.

It is desirable in such frequency to digital converters to have an output available at reasonably regular intervals regardless of whether the input frequency is high or is low. This is of particular significance when the output is to be used as part of a closed loop feedback system, for example, a speed control system. However, prior art frequency to digital converters of this type provide output information at widely different intervals depending on the frequency of the input signal. In addition, a finite time is necessary, after receiving the input signal, to provide the digital representation thereof. As the frequency of the input signal increases and the period becomes shorter, there may be insufficient time to complete the calculation of the digital representation of frequency.

SUMMARY OF THE INVENTION

The present invention overcomes the disadvantages of the prior art apparatus of which this type by providing sufficient time for updating of the frequency determination and by providing an output at substantially regular intervals, where the final output can be a digital or an analog representation of frequency.

It is therefore an object of this invention to provide a frequency determining apparatus that has an output signal updated at substantially regular intervals over a wide range of input frequencies.

It is another object of the invention to provide an improved frequency determining apparatus, particularly suitable for a closed feedback loop, wherein the time to complete the frequency determination is not unduly reduced at higher frequencies.

The frequency determining apparatus of the present invention includes a dynamic prescaler. The prescaler is a divider which receives the input signal and divides the frequency of the input signal by a factor "n". The resulting signal or intermediate signal is then applied to a gated counter which is gated on for a time interval representing the period of the intermediate signal. A high frequency pulse generator or clock provides a pulse signal to the gated counter which counts the number of pulses in the time interval for which the counter is gated on. The signal representing the count is then applied to a calculator which, knowing "n", is able to calculate the frequency of the input signal. The calculator also provides a signal representing "n" in accordance with the value of the frequency of the input signal, and this is applied to the divider. The calculator provides an output signal, in digital or analog form, representing the calculated frequency of the input signal.

Thus, in accordance with the invention there is provided a frequency determining apparatus comprising, frequency divider means for receiving an input signal of unknown frequency and dividing said input signal by a factor n to provide an adjusted signal, gate means responsive to said adjusted signal for changing to an enabled condition for a time period related to the period of said adjusted signal, a clock pulse generator connected to said gate means for providing thereto a stable clock pulse signal having a predetermined frequency, and counter means connected to said gate means for receiving said clock pulses when said gate is enabled, correcting by the factor n the count of pulses obtained during a time period when the gate is enabled, and deriving therefrom an output signal representing the frequency of said input signal, said counter means including detection means for detecting predetermined upper and lower limits and responsive thereto for changing the factor n to maintain sad adjusted signal within a predetermined range of frequencies.

DESCRIPTION OF THE PREFERRED EMBODIMENTS

Figure 1:
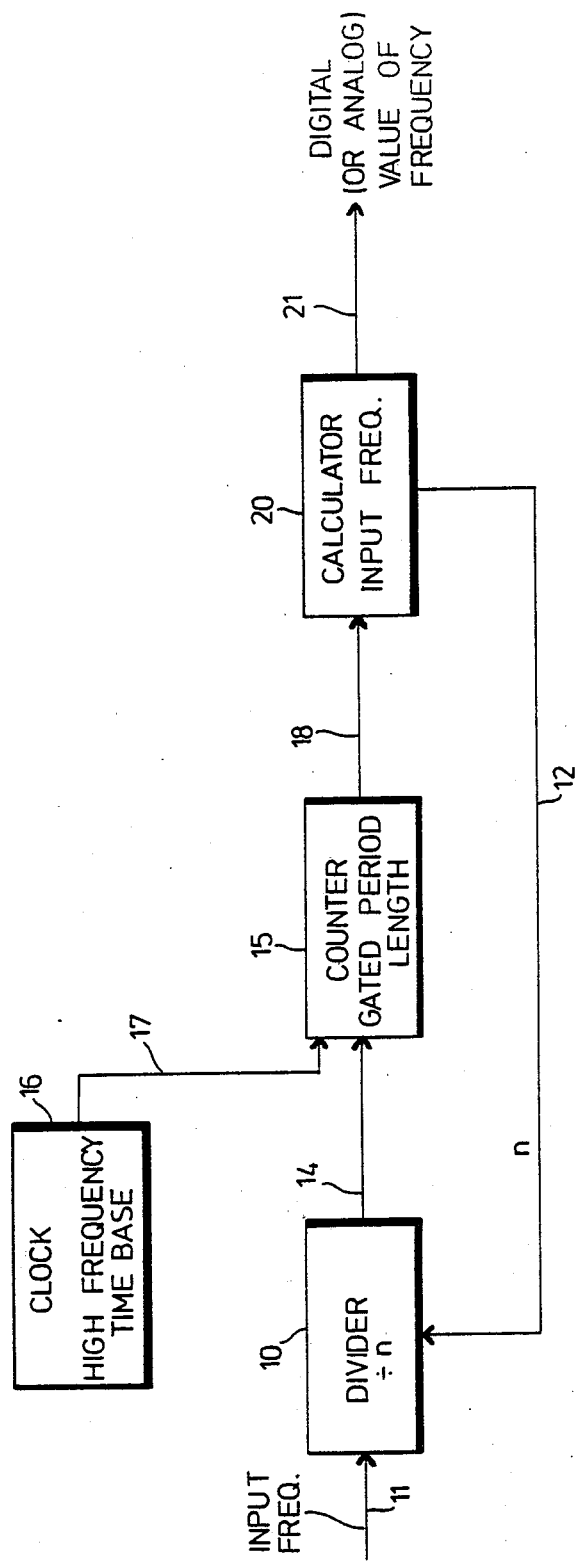
FIG. 1 is a schematic block diagram showing the invention in one of its simplest forms.

Referring now to FIG. 1, there is shown a divider 10 which divides the frequency of any signal applied to its input by n where n is a variable, and is normally a variable integer. Divider 10 has an input signal 11 applied thereto and input signal 11 has a frequency whose value is to be converted to digital form. The divider 10 receives a signal representing in on line 12 and the output of divider 10 is at 14 representing the frequency of the input signal divided by n which may be referred to as the adjusted signal. A gated counter 15 receives the adjusted signal from 14, determines the period, and gates the counter n for that period. A clock 16 provides a stable source of high frequency pulses on conductor 17 and this pulse wave is applied to counter 15 which counts the number of pulses received while it is gated on. This number of pulses is provided at 18 and applied to calculator 20. Calculator 20 thus has the count of pulses which occurred and it includes a memory which retains the value of n, and it can therefore determine the frequency of the input signal at 11. The calculator 20 then provides two outputs. It provides an output signal at output 21 representing the frequency of the input signal at 11, and it conveniently provides this signal in digital form as the calculator 20 normally receives its input in digital form. It can, however, incorporate at its output a digital to analog converter to convert the output to an analog signal.

Calculator 20 also determines if the frequency of the input signal has changed sufficiently that the value for factor n should be revised. In a preferred form, values defining a range of frequencies or band are set into the calculator. The values are different for increasing and decreasing directions in the band to provide a deadband. If the count provided to the calculator increases above the upper value or decreases below the lower value, then n is revised and the revised n placed in memory.

It will be seen that a proper selection of bands and of the factor n, will keep the output of counter 15 within predetermined limits. For example, suppose n=1, suppose the input signal has a frequency of corresponding to a period T, and the counter 15 counts just over 10,000 pulses. Also suppose the calculator 20 has a lower predetermined value of 10,000 defining a lower band limit. Now, if the number of counts drops below 10,000 (indicating a shorter period T and a higher frequency f), then calculator 20 doubles n so that now n=2. The output from divider 10 at 14 is f'/2 and the period is 2T'. The period has doubled in length at the changeover point and the counter 15 now counts 20,000 pulses at the changeover. If the frequency of the input signal 11 keeps increasing, the period will keep decreasing and the counter 15 will have a decreasing count until 10,000 is reached again and at that point n is again doubled so that n=4. Thus, it is convenient to have n change by doubling, i.e., 2, 4, 8, 16, 32, 64, 128 etc. If finer steps are required, the series 2, 3, 4, 6, 8, 12, 16, 24, 32 might be suitable. Considering the other direction, as the frequency decreases and the period lengthens, it is desirable to have the changeover at a slightly different frequency to provide an overlap. This is to prevent changing back and forth from one n value to another if the input frequency should oscillate about the changeover point. For example, it decreasing counts cause a change in n at 10,000 as described above, increasing counts might cause a change at say 22,000 which would drop the counts back to 11,000. A continued increase in the count would cause a change in factor n at 22,000 in the same way or a decrease in the count to 10,000 would change the factor n as previously described raising the count at changeover to 20,000.

It will, of course, be apparent that the changes in factor n may be represented by any convenient series or sequence of numbers.

Figure 2:
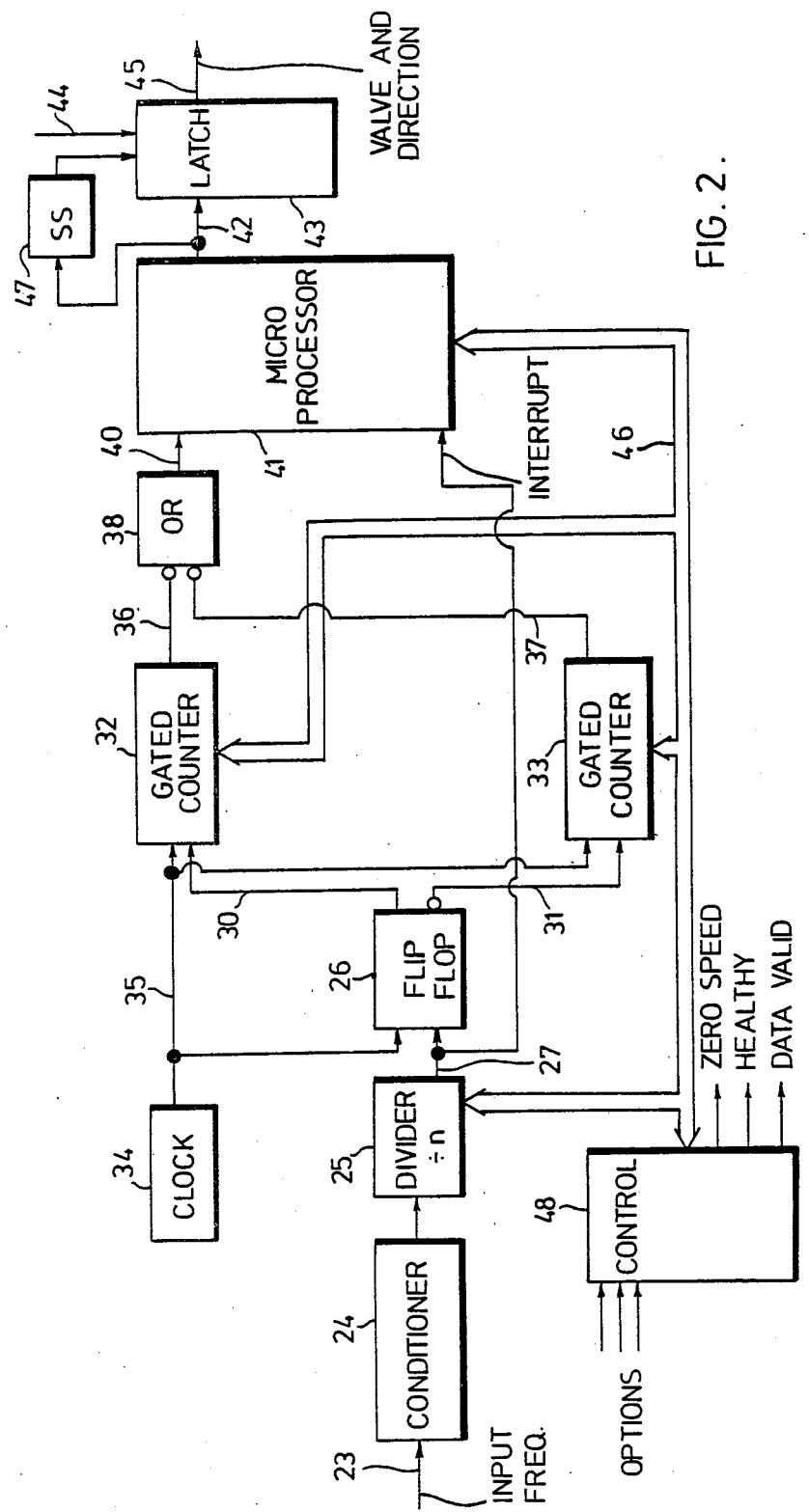
FIG. 2 is a schematic block diagram showing an embodiment of the invention in more detail.

Referring now to FIG. 2, the simplified block diagram shows in more detail the invention incorporated in circuitry that might be used in a speed control system where the input at 23 might be a series of pulses from a tachometer. The input is received by a signal conditioner 24 which may include circuitry for reducing any hysteresis effects and for reducing or eliminating any jitter that is present. Such circuits are known and examples may be found in the literature, such as in Burr-Brown Electronics series of Text books on operational amplifiers. The output from conditioner 24 is applied to divider or prescaler 25 which divides by a factor n. The output from divider 25 is connected to a flip flop 26 by conductor 27. The flip flop 26 is triggered from one state to another by the signal on conductor 27, and in turn, flip flop 26 provides enabling signals on conductors 30 and 31 to gated counters 32 and 33 respectively. Thus, gated counters 33 and 33 are alternately enabled.

A clock 34 provides clock pulses on conductor 35 and these are applied to gated counters 32 and 33. When a respective one of gated counters 32 and 33 is enabled the pulses from conductor 35 are counted and are provided to microprocessor 41 via bus 46. Overflow pulses from gated counters 32 and 33 are supplied over conductors 36 and 37 through OR gate 38 and conductor 40 to microprocessor 41. Microprocessor 41 provides a calculated output signal over conductor 42 to latch 43. The count is held in latch 43 until a signal is applied at input 44 providing the latched count at output 45. The microprocessor 41 also determines the factor n as was previously described.

Conductor 27 is connected to microprocessor 41 to provide an interrupt signal to indicate that divider 25 has completed its divide cycle and one of the gated counters 32 or 33 is ready for servicing by the microprocessor 41.

The bus 46 interconnects microprocessor 41 with gates 32 and 33 and with divider 25. The signal representing the factor n, as determined by the microprocessor 41, is provided to divider 25 over the bus 46. The interconnection of bus 46 with gated counters 32 and 33 is for transmission of the pulse period count to microprocessor 41.

The single shot multivibrator 47, connected between conductor 42 and latch 43, serves to strobe output date into latch 43 ensuring simultaneous update of all bits.

Conductor 35 is connected to flip flop 26 to provide synchronization between the clock 34 and flip flop 26 and thus between clock 34 and the gate of gated counters 32 and 33.

A control 48 may be provided to, for example, change the scaling factor or to alter the affects of conditioner 24. It was previously mentioned that the scaling could conveniently be for n the values of 2, 4, 8, 16, 32 etc., but that conditions might require another series. This can be changed by control 48. Also, control 48 conveniently can provide output signals, for example, in the form of indicator lights, to show when the input frequency is zero, to show that the apparatus is operating and that the data is valid. While the control 48 is not essential to the invention, it is convenient to have for operating purposes.

Figure 3:
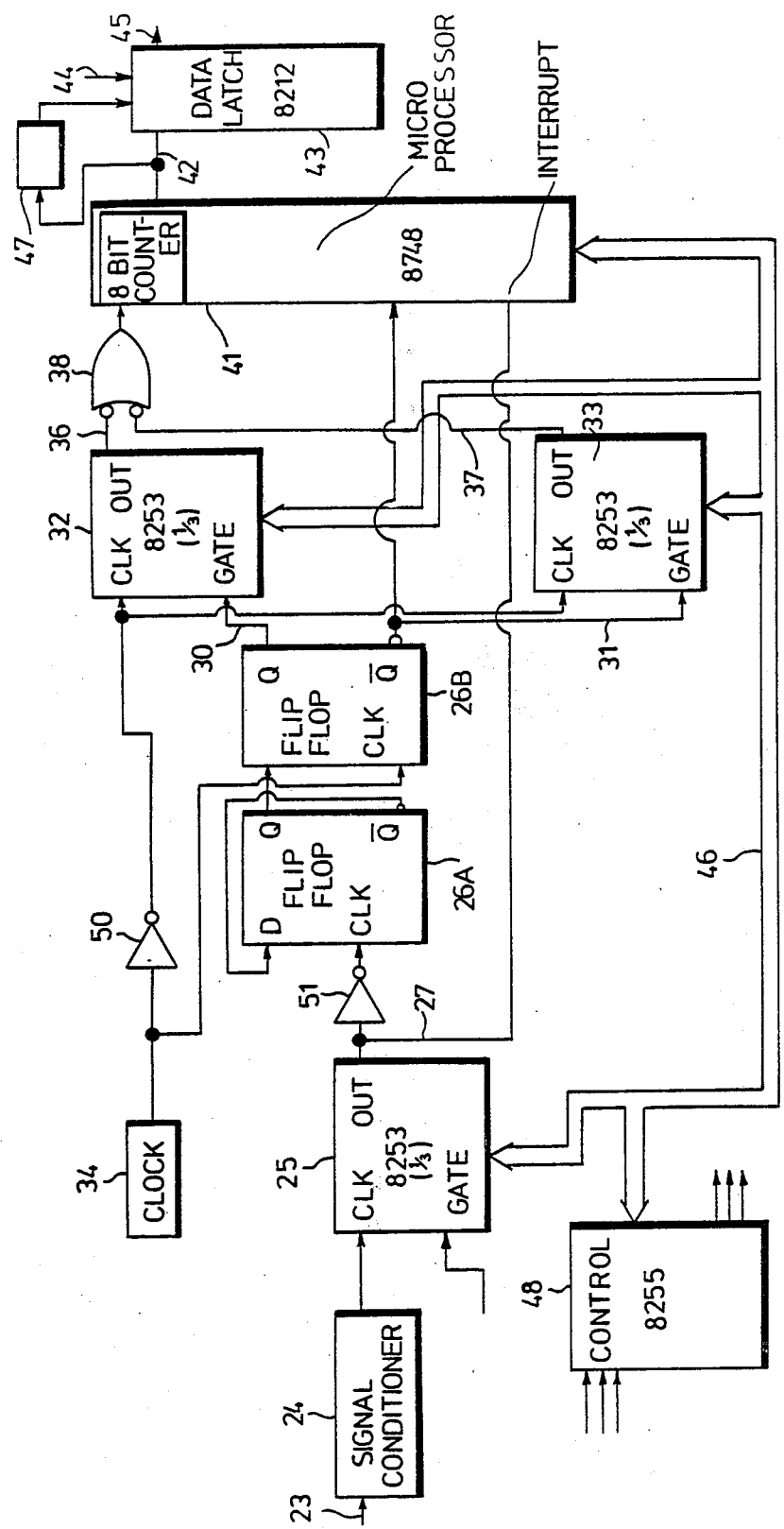
FIG. 3 is a diagram similar to FIG. 2 but indicating typical components for several of the blocks of FIG. 2.

Referring briefly to FIG. 3, this diagram is included only to provide an indication of typical components suitable for circuitry of a similar nature to FIG. 3. In FIG. 3 there are two inverters 50 and 51 which are not in FIG. 2. The inverters 50 and 51 provide inverted signals required in the specific circuitry of FIG. 3. Also, in FIG. 3 there are two flip flops 26A and 26B rather than the single flip flop 26 of FIG. 2. The two flip flops 26A and 26B provide the period counter gate control for the gates of gated counters 32 and 33 and the necessary synchronization with the clock pulses from clock 34. The operation is generally as described in connection with FIG. 2 and it is believed no further explanation is necessary.

It is believed the frequency determining apparatus of this invention, its structure and operation, will be clearly understood from the preceding description, and the scope of the invention will be defined in the claims.

What I claim as new and desire to secure by Letters Patent of the United States is:

1. Frequency determining apparatus comprising,
    frequency divider means for receiving an input signal of unknown frequency and dividing said input signal by a factor n to provide an adjusted signal,
    gate means responsive to said adjusted signal for changing to an enabled condition for a time period related to the period of said adjusted signal,
    a clock pulse generator connected to said gate means for providing thereto stable clock pulses having a predetermined frequency; and counter means connected to said gate means for receiving said clock pulses when said gate is enabled, counting the received clock pulses, deriving from the count of the pulses obtained during a time period when the gate is enabled a value for the frequency of said adjusted signal, and multiplying said value by said factor n to provide an output signal representing the frequency of said input signal, said counter means having a predetermined upper and lower limit for said count and being responsive to said count falling below said lower limit to increase the factor n to the next larger value in a fixed ascending series of values and being responsive to said count exceeding said upper limit to decrease the factor n to the next smaller value in said series, for maintaining the count within said upper and lower limits and said adjusted signal within a predetermined range of frequencies.

2. Frequency determining apparatus as defined in claim 1 in which the factor n is an integer.

3. Frequency determining apparatus as defined in claim 1 in which said fixed ascending series of values is a series in which each value in the series is a number double the preceding number.

4. Frequency determing apparatus comprising,
a frequency divider for receiving an input signal of unknown frequency and dividing said input signal by a factor n to provide an adjusted signal, the factor n being a value in a series of discrete values of increasing quantity,
a flip flop responsive to said adjusted signal from said frequency divider to switch between a first and a second condition each for a time interval related to a period of said adjusted signal,
a clock pulse generator for generating clock pulses,
a first and a second gated counter each connected to said flip flop and to said clock pulse generator, and being alternately enabled respectively by a signal from said flip flop in said first condition and in said second condition to count said clock pulses when enabled, and
a microprocessor interconnected with said first and second gated counters to receive the counts alternately therefrom, to derive from the counts a digital representation of the frequency of said adjusted signal, and to multiply said digital representation of the frequency of said adjusted signal by the factor n to correct the digital representation of the frequency of said adjusted signal to represent the frequency of said input signal,
said microprocessor having stored therein values representing a lower and an upper limit for said counts and including means for determining when the counts decrease past said lower limit and when the counts increase past said upper limit to respectively increase and to decrease the factor n to the next higher or lower factor in said series thereby maintaining the counts in a predetermined band.

5. Frequency determining apparatus as defined in claim 4 in which the factor n is an integer in a series of integers.

6. Frequency determining apparatus as defined in claim 5 in which said upper limit has a value which is greater than said lower limit multiplied by the quotient of the larger of adjacent integers in said series divided by the smaller of said adjacent integers.

7. Frequency determining apparatus as defined in claim 6 in which said input signal is a pulse train.

8. Frequency determining apparatus comprising,
frequency divider means for receiving an input signal of unknown frequency and dividing said input signal by a factor n to provide an adjusted signal,
said factor n being a number in an ascending/descending series of numbers,
a clock pulse generator for providing a stable clock pulse signal having a predetermined frequency,
a gated counter means responsive to said adjusted signal for changing to an enabled condition for a time interval related to the period of said adjusted signal and connected to said clock pulse generator to receive said clock pulse signal and when enabled to count the pulses in said clock pulse signal, and provide a count signal representing the count, and
calculator means responsive to the count signal to correct the count by dividing the count by said factor n and to derive therefrom an output signal representing the frequency of said input signal,
said calculator means having predetermined upper and lower limits and being responsive to the count signal representing a count increasing past said upper limit and decreasing past said lower limit to respectively decrease said factor n and increase said factor n to the next number in said series of numbers to maintain said count between said upper and lower limits.

* * * * *